United States Patent [19]

Barchet

[11] 4,089,576
[45] May 16, 1978

[54] INSULATED CONNECTION OF PHOTOVOLTAIC DEVICES

[75] Inventor: Reinhold J. Barchet, Collegeville, Pa.

[73] Assignee: General Electric Company, Fairfield, Conn.

[21] Appl. No.: 752,666

[22] Filed: Dec. 20, 1976

[51] Int. Cl.² ............................................ H01R 25/00
[52] U.S. Cl. .............................. 339/18 P; 339/125 R; 339/263 R
[58] Field of Search .................. 339/18 C, 18 P, 19, 339/96–99, 119, 125, 222, 263 R

[56] References Cited

U.S. PATENT DOCUMENTS

| 3,208,029 | 9/1965 | Leslie | 339/18 C |
| 3,258,730 | 6/1966 | Husband et al. | 339/18 C |
| 3,465,283 | 9/1969 | Deakin | 339/18 P |
| 3,626,362 | 12/1971 | Kellerman | 339/263 R |

FOREIGN PATENT DOCUMENTS

| 2,143,404 | 3/1973 | Germany | 339/97 R |
| 379,946 | 6/1973 | U.S.S.R. | 339/263 R |

*Primary Examiner*—Joesph H. McGlynn
*Attorney, Agent, or Firm*—Raymond H. Quist; Allen E. Amgott

[57] ABSTRACT

The electric terminals or leads of photovoltaic devices to be interconnected into an array are encased in the insulating layers of the devices. Guideholes pass through the devices and the terminals. Fasteners having an insulated head and shank with a conductive means on the shank are positioned so that the conductive means is in contact with the terminals. Screw and nail type fasteners are disclosed.

3 Claims, 3 Drawing Figures

INSULATED CONNECTION OF PHOTOVOLTAIC DEVICES

BACKGROUND OF THE INVENTION

This invention relates generally to photovoltaic devices and more particularly to improved electrical connection of such devices together.

Customarily, a plurality of individual photovoltaic or solar cells are fabricated into a module (which in this description will be denoted a photovoltaic device) having a positive and negative terminal. These photovoltaic devices are then connected in various series and parallel relationships to form an array having a voltage and current which is a multiple of that of the photovoltaic device. In current practice the positive and negative terminals of photovoltaic devices are in the form of protruding leads or pins which are connected by conventional techniques. As the assembly of the array (for example on the roof of a building) proceeds, the voltage builds up to hundreds or even thousands of volts. Consequently, those assembling the array are exposed to hazardously high voltages. In addition, the interconnections are exposed to the degrading effects of the atmosphere which reduce the reliability and life of the array.

SUMMARY OF THE INVENTION

Electrical connection of photovoltaic devices into an array while maintaining an insulated exposed surface is performed. The electric terminals of the photovoltaic devices are encased in the insulation of the devices. Fasteners having a nonconducting head and shank with a conductive means on the shank are positioned so that the conductive means is in contact with the terminals.

DESCRIPTION OF THE PREFERRED EMBODIMENTS

Figure 1:
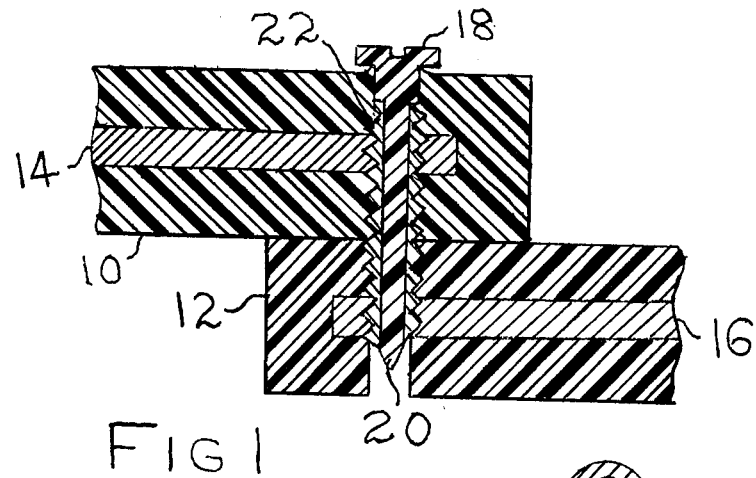
FIG. 1 is a schematic cross-section of one embodiment of the invention.

FIG. 1 shows the end portions of photovoltaic devices 10 and 12. Conductors 14 and 16 are encased in a flexible insulator such as Teflon or other plastic. Conductors 14 and 16 are connected to the cells of their respective photovoltaic devices 10 and 12.

Figure 2:
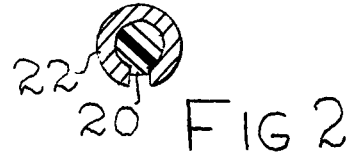
FIG. 2 is a schematic detail in cross-section of the fastener of FIG. 1.

In accordance with the invention, a screw-type fastener is used to electrically connect conductors 14 and 16. Head 18 and shank 20 are formed of a nonconducting material such as phenolic. Surrounding shank 20, and secured to it by adhesive or the like, is sleeve 22. Sleeve 22 is fabricated of electrically-conducting material and has self-tapping screw threads formed on its outer surface. As shown in FIG. 2 a key may formed on shank 20 to add torsional strength to the fastener and to permit extraction of the head 18 and shank 20, if so desired, after installation of the sleeve 22. In this case, "plastic" plugs are inserted in the clearance holes (top and bottom) in the photovoltaic devices 10 and 12.

Figure 3:
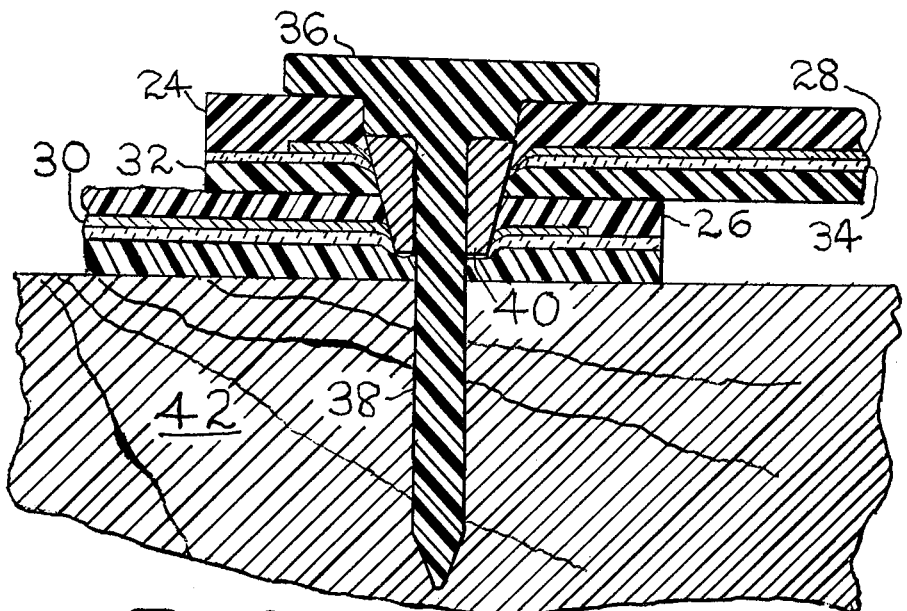
FIG. 3 is a schematic cross-section of another embodiment of the invention.

Referring next to FIG. 3, the end portions of photovoltaic devices 24 and 26 are shown. Conductor 28 may be considered the negative terminal of device 24, while conductor 30 may be considered the positive terminal of device 26.

Although photovoltaic devices 24 and 26 could be of the same type as those shown in FIG. 1, the FIG. 3 structure is also suitable. Thus, using photovoltaic device 24 as an example, base 32 is of a flexible, nonconducting material such as alphalt, silicone or Teflon sheet. Substrate 34 may be of Fiberglas, for example.

A nail-type fastener is used to electrically connect conductors 28 and 30. Head 36 and shank 38 are formed of high-impact-strength, nonconducting material such as nylon or phenolic. Conducting collar 40 is secured to shank 38 by adhesive or the like.

Whether the fastener of FIG. 1 is screwed in, or the fastener of FIG. 3 is hammered in, the end result is that conducting member is put into contact with the conducting terminals of the two photovoltaic devices, thereby electrically connecting them. Also as shown in FIG. 3, by making shank 38 long enough, the photovoltaic devices may be simultaneously secured to wood 42 of a roof or the like.

As shown in both FIGS. 1 and 3, it may be desired to include an enlarged shoulder portion on the shanks of the fasteners to provide a reinforced bearing surface and to promote sealing against intrusion of water to the electrical interface. The photovoltaic devices are provided with guideholes for the fasteners to pass through.

It should be apparent that the exposed surface of any array fabricated will be completely insulated, and that the electrical connections are reasonably well protected from the elements.

Although two embodiments of the invention have been illustrated and described, it will be evident that changes and modifications can be made without departing from the spirit of the invention and the scope of the appended claims.

I claim:

1. A fastener for electrically connecting the conductor of one photovoltaic device to that of another comprising:
   a nonconducting head and shank;
   conducting means on said shank, whereby the electrical connection is made when the shank is positioned in the conductors of said photovoltaic devices; and
   said conducting means on said shank has screw threads on its outer surface.

2. A fastener in accordance with claim 1 wherein:
   said shank has a longitudinally extending key portion to fit in a corresponding keyway on said conducting means.

3. A fastener in accordance with claim 2 wherein:
   said shank and said conducting means on said shank extend beyond said photovoltaic devices into a supporting structure.

* * * * *